United States Patent
Lee et al.

(10) Patent No.: US 8,344,780 B2
(45) Date of Patent: Jan. 1, 2013

(54) FLIP-FLOP CIRCUITS AND SYSTEM INCLUDING THE SAME

(75) Inventors: Hyoung-Wook Lee, Seoul (KR); Min-Su Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 231 days.

(21) Appl. No.: 12/797,852

(22) Filed: Jun. 10, 2010

(65) Prior Publication Data

US 2010/0315144 A1    Dec. 16, 2010

(30) Foreign Application Priority Data

Jun. 16, 2009    (KR) .................. 10-2009-0053170

(51) Int. Cl.
    *H03K 3/00*    (2006.01)
(52) U.S. Cl. ........................................ 327/218; 326/98
(58) Field of Classification Search .......... 327/199–203, 327/205, 206, 214, 218; 326/98
    See application file for complete search history.

(56) References Cited

U.S. PATENT DOCUMENTS 5,898,330 A * 4/1999 Klass ........................... 327/210

FOREIGN PATENT DOCUMENTS

| JP | 2004-201185 | | 7/2004 |
| KR | 1020000036621 | A | 7/2000 |
| KR | 1020070069256 | A | 7/2007 |
| KR | 1020080066693 | A | 7/2008 |

* cited by examiner

*Primary Examiner* — Lincoln Donovan
*Assistant Examiner* — Diana J Cheng
(74) *Attorney, Agent, or Firm* — Myers Bigel Sibley & Sajovec

(57) ABSTRACT

Flip-flop circuits including a dynamic input unit and a control clock generator are provided. The dynamic input unit precharges an evaluation node to a power supply voltage in a first phase of a clock signal, selectively discharges the evaluation node based on input data in a second phase of the clock signal, and compensates for voltage drop of the evaluation node in response to a first control clock signal. The control clock generator generates the first control clock signal and a second control clock signal based on at least the clock signal.

11 Claims, 9 Drawing Sheets

FLIP-FLOP CIRCUITS AND SYSTEM INCLUDING THE SAME

CLAIM OF PRIORITY

This application claims priority to Korean Patent Application No. 10-2009-0053170, filed Jun. 16, 2009, the contents of which are hereby incorporated herein by reference as if set forth in its entirety.

FIELD

The present invention relates to circuits, more particularly, to flip-flop circuits and related systems.

BACKGROUND

Generally, semi-dynamic flip-flops have two operation modes. When the semi-dynamic flip-flops transitions between the two operation modes, keep circuits are used for reducing the likelihood, or possibly preventing, signal fighting. However, when the semi-dynamic flip-flops adopt the keep circuits, there are trade-offs between operating speed and noise. In other words, semi-dynamic flip-flops are not easily applicable to applications that require a high speed and relatively less noise.

SUMMARY

Some embodiments discussed herein provide a flip-flop circuit including a dynamic input unit and a control clock generator. The dynamic input unit precharges an evaluation node to a power supply voltage in a first phase of a clock signal, selectively discharges the evaluation node based on input data in a second phase of the clock signal, and compensates for voltage drop of the evaluation node in response to a first control clock signal. The control clock generator generates the first control clock signal and a second control clock signal based on at least the clock signal.

In further embodiments, the flip-flop circuit may further include a static output unit which maintains state of output data in the first phase of the clock signal and configured to invert an internal signal to provide the output data in the second phase of the clock signal and the internal signal is provided at the evaluation node.

In still further embodiments, the static output unit may include a driver maintains state of the output data or inverts the internal signal to provide the output data depending on the phase of the clock signal, and a latch unit that latches the out data to provide an inverted output data.

In some embodiments, the dynamic input unit may include an evaluation unit that includes a plurality of transistors and the evaluation node, each of the transistors receiving each of the clock signal, the second control clock signal and the input data, a keeper circuit, connected to the evaluation node, which maintains voltage level of the evaluation node in response to the second control clock signal and a compensation circuit, connected to the evaluation node, which compensates for voltage drop of the evaluation node in response to the first control clock signal.

In further embodiments, the evaluation unit may include a p-channel metal oxide semiconductor (PMOS) transistor, connected between a power supply voltage and the evaluation node, which has a gate receiving the clock signal, a first n-channel metal oxide semiconductor (NMOS) transistor, connected to the evaluation node, which has a gate receiving the second control clock signal, at least one second NMOS transistor, connected to the first NMOS transistor, which has a gate receiving the input data and a third NMOS transistor, connected between the second NMOS transistor and a ground, which has a gate receiving the clock signal.

In still further embodiments, the input data may include a plurality of bits, and the at least one second NMOS transistor may include a plurality of transistors, each gate of the transistors receiving each bit of the input data.

In some embodiments, the evaluation unit may include a PMOS transistor, connected between a power supply voltage and the evaluation node, which has a gate receiving the clock signal, a first NMOS transistor, connected to the evaluation node, which has a gate receiving the input data, a second NMOS transistor, connected to the first NMOS transistor, which has a gate receiving the second control clock signal and a third NMOS transistor, connected between the second NMOS transistor and a ground, which has a gate receiving the clock signal.

In further embodiments, the compensation circuit may include a PMOS capacitor which has a gate receiving the first control clock signal and a source and a drain which are connected to the evaluation node.

In still further embodiments, the PMOS capacitor may compensate for the voltage drop of the evaluation node by injecting trapped charges to the evaluation node in response to low to high transition of the first control clock signal.

In some embodiments, the keeper circuit may include a PMOS transistor, connected between a power supply voltage and the evaluation node, which has a gate receiving the second control clock signal.

In further embodiments, the keeper circuit may include a first PMOS transistor, connected to a power supply voltage, which has a gate receiving the second control clock signal, a second PMOS transistor connected between the first PMOS transistor and a first node connected to the evaluation node, a first NMOS transistor connected to the second NMOS transistor at the first node, a second NMOS transistor, connected between the first NMOS transistor and a ground, which has a gate receiving the clock signal, an inverter connected between the evaluation node and a second node at which gates of the second PMOS transistor and the first NMOS transistor are commonly connected.

In still further embodiments, the control clock generator may include a first inverter that inverts the clock signal, a second inverter that inverts output of the first inverter to provide the first control clock signal and a NAND gate that performs a NAND operation on output of the second inverter and an internal signal to provide the second control clock signal, the internal signal being provided at the evaluation node.

In some embodiments, the control clock generator may include a first inverter that inverts the clock signal, a second inverter that inverts output of the first inverter to provide the first control clock signal and a third inverter that inverts out put of the second inverter to provide the second control clock signal.

Further embodiments discussed herein provide a flip-flop circuit including a pulse generator, a dynamic input unit and a static output unit. The pulse generator generates a delayed clock signal and a pulse signal based on a clock signal, and the pulse signal is synchronized with a rising edge of the clock signal with a delay and has an activation interval shorter than the clock signal. The dynamic input unit precharges an evaluation node to a power supply voltage in a first phase of the pulse signal, selectively discharges the evaluation node based on input data in a second phase of the pulse signal, and compensates for voltage drop in response to the delayed clock signal. The static output unit maintains state of output data in the first phase of the pulse signal and inverts an internal signal to provide the output data in the second phase of the pulse signal, and the internal signal is provided at the evaluation node.

In still further embodiments, the dynamic input unit may include an evaluation unit that includes a plurality of transistors and the evaluation node, each of the transistors receiving each of the pulse signal and the input data and a compensation circuit, connected to the evaluation node, which compensates for voltage drop of the evaluation node in response to the delayed clock signal.

Some embodiments discussed herein provide a computer system including a processing unit and a flip-flop circuit. The flip-flop circuit includes a dynamic input unit, a control clock generator and a static output unit. The dynamic input unit precharges an evaluation node to a power supply voltage in a first phase of a clock signal, selectively discharges the evaluation node based on input data in a second phase of the clock signal, and compensates for voltage drop of the evaluation node in response to a first control clock signal. The control clock generator generates the first control clock signal and a second control clock signal based on at least the clock signal. The static output unit maintains state of output data in the first phase of the clock signal and configured to invert an internal signal to provide the output data in the second phase of the clock signal and the internal signal is provided at the evaluation node.

DETAILED DESCRIPTION OF EMBODIMENTS

Figure 1:
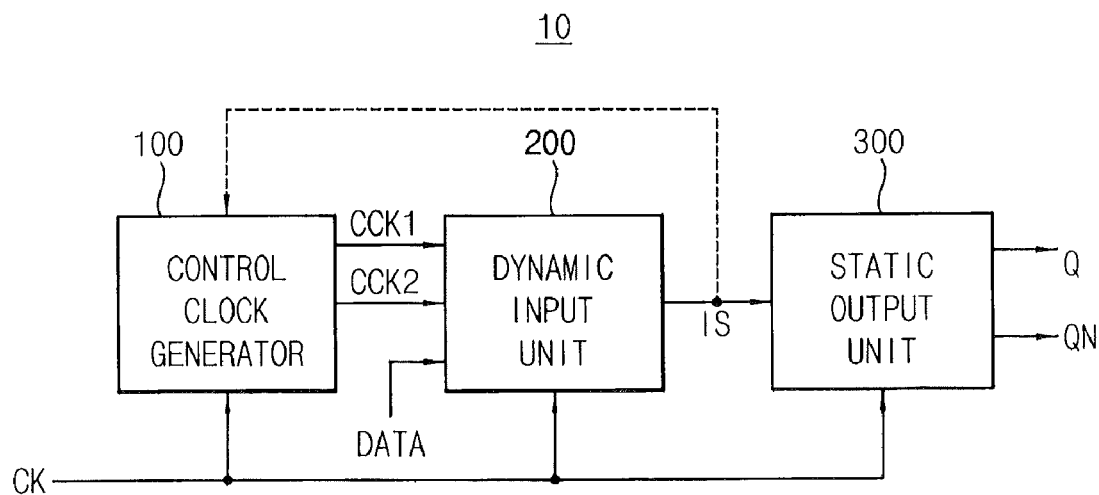
FIG. 1 is a block diagram illustrating a flip-flop circuit in accordance with some embodiments discussed herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring first to FIG. 1, a block diagram illustrating flip-flop circuits in accordance with some embodiments will be discussed. As illustrated in FIG. 1, a flip-flop circuit 10 includes a control clock generator 100, a dynamic input unit 200 and a static output unit 300. The control clock generator 100 is configured to generate a first control clock signal CCK1 and a second control clock signal CCK2 based on at least a clock signal CK. The dynamic input unit 200 is configured to evaluate input data DATA based on logic information including the input data DATA and the clock signal CK according to a phase of the clock signal CK. The dynamic input unit 200 includes an evaluation node NE (FIG. 2), and an internal signal IS representing the evaluation result is provided at the evaluation node NE. The dynamic input unit 200 precharges the evaluation node NE in a first phase of the clock signal CK. The dynamic input unit 200 evaluates the input data DATA and selectively discharges the evaluation node NE according to the evaluation result. The static output unit 300 maintains a state of the input data DATA or inverts the internal signal IS and provides the inverted internal signal IS as an output data Q. Furthermore, the static output unit 300 provides an inverted output data QN.

Through example embodiments, the first phase of the clock signal CK corresponds to logic low level (i.e., digital "0"), and the second phase of the clock signal CK corresponds to logic high level (i.e., digital "1"). However, embodiments are not limited to this configuration. For example, the first phase of the clock signal CK may correspond to logic high level (i.e., digital "1"), and the second phase of the clock signal CK may correspond to logic low level (i.e., digital "0") without departing from the scope of the present application.

Figure 2:
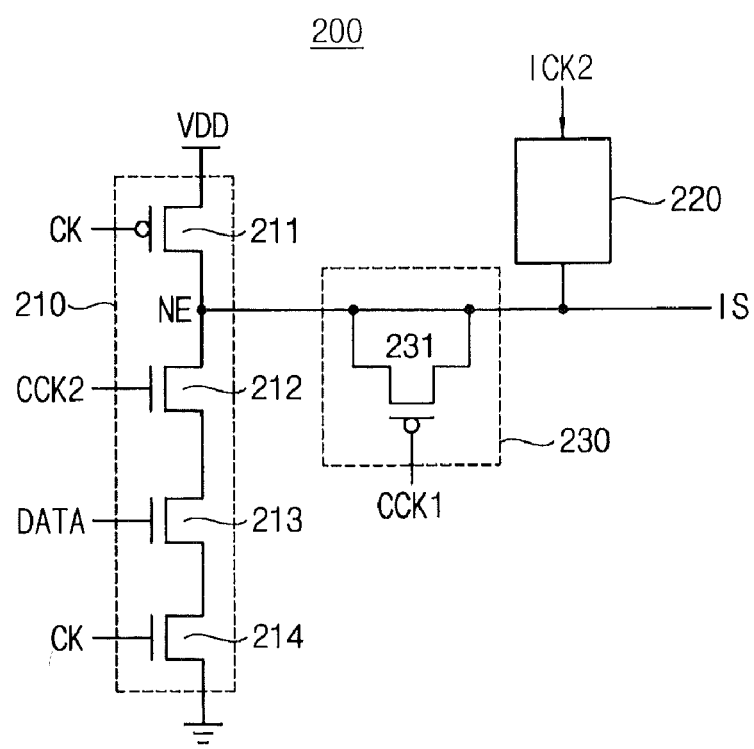
FIG. 2 is a circuit diagram illustrating a dynamic input unit of FIG. 1 in accordance with some embodiments discussed herein.

Referring now to FIG. 2, a circuit diagram illustrating a dynamic input unit of FIG. 1 in accordance with some embodiments will be discussed. As illustrated in FIG. 2, the dynamic input unit 200 may include an evaluation unit 210, a keeper circuit 220 and a compensation circuit 230. The evaluation unit 210 includes a plurality of transistors 211~214 which are cascade-connected between a power supply voltage VDD and a ground. The plurality of transistors 211~214 include a p-channel metal oxide semiconductor (PMOS) transistor 211 and n-channel metal oxide semiconductor (NMOS) transistors 212, 213 and 214. The PMOS transistor 211 is connected between the power supply voltage VDD and the evaluation node NE, and has a gate receiving the clock signal CK. The NMOS transistor 212 is connected to the evaluation node NE, and has a gate receiving the second control clock signal CCK2. The NMOS transistor 213 is connected to the NMOS transistor 212, and has a gate receiving the input data DATA. The NMOS transistor 214 is connected between the NMOS transistor 213 and the ground, and has a gate receiving the clock signal CK.

The evaluation unit 210 precharges the evaluation node NE to a level of the power supply voltage VDD in the first phase of the clock signal CK, and selectively discharges the evaluation node NE in the second phase of the clock signal CK based on the logic information including the input data DATA and the clock signal CK.

The keeper circuit 220 maintains the voltage level of the evaluation node NE, i.e., the internal signal IS in response to the second control clock signal CCK2.

The compensation circuit 230 compensates for voltage drop of the evaluation node NE in response to the first control clock signal CCK1. The compensation circuit 230 may include a PMOS capacitor 231 which has a gate receiving the first control clock signal CCK1, a drain connected to the evaluation node NE and a source connected to the evaluation node NE. Operations of the keeper circuit 220 and the compensation circuit 230 will be discussed further herein.

Figure 3A:
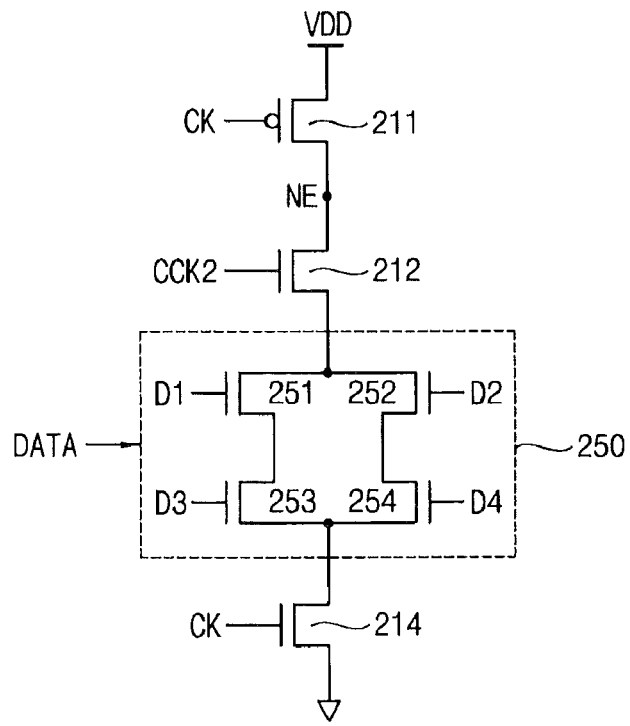
FIGS. 3A and 3B are circuit diagrams illustrating an evaluation unit of FIG. 2 in accordance with some embodiments.
Figure 3B:
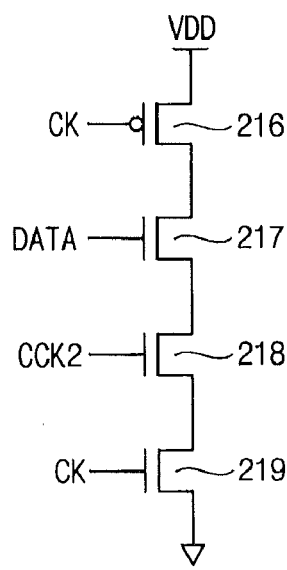

Referring now to FIGS. 3A and 3B, circuit diagrams illustrating the evaluation unit of FIG. 2 in accordance with some embodiments will be discussed. As illustrated in FIG. 3A, an evaluation unit 210a may include the PMOS transistor 211, the NMOS transistor 212, a plurality of NMOS transistors 250 and the PMOS transistor 214. In FIG. 3A, the input data DATA includes a plurality of bits, i.e., a plurality of data D1, D2, D3 and D4. The plurality of NMOS transistors 250 are connected between the NMOS transistor 212 and the NMOS transistor 214. The evaluation unit 210a of FIG. 3A differs from the evaluation unit 210 in FIG. 2 in that the plurality of NMOS transistors 250 include NMOS transistors 251, 252, 253, and 254. The NMOS transistor 251 is connected to the NMOS transistor 212 and has a gate receiving data D1 of the input data DATA. The NMOS transistor 252 is connected to the NMOS transistor 212 and has a gate receiving data D2 of the input data DATA. The NMOS transistor 253 is connected between the NMOS transistor 251 and the NMOS transistor 214 and has a gate receiving data D3 of the input data DATA.

The NMOS transistor 254 is connected between the NMOS transistor 252 and the NMOS transistor 214 and has a gate receiving data D4 of the input data DATA. The NMOS transistors 251 and 253 are cascade-connected between the NMOS transistors 212 and 214. The NMOS transistors 252 and 254 are case code-connected between the NMOS transistors 212 and 214.

Although not illustrated, the NMOS transistors 251, 252, 253, and 254 may implement various logics according to relationship of connection of one another. For example, when the NMOS transistors 251, 252, 253, and 254 are connected in parallel with respect to each other between the NMOS transistors 212 and 214, an OR logic may be implemented. On the other hand, when the NMOS transistors 251, 252, 253, and 254 are cascade-connected with respect to each other between the NMOS transistors 212 and 214, an AND logic may be implemented.

Referring now to FIG. 3B, an evaluation unit 210b may include PMOS transistor 216 and the NMOS transistors 217, 218 and 219 which are cascade-connected between the power supply voltage VDD and the ground. The PMOS transistor 216 is connected between the power supply voltage VDD and the evaluation node NE, and has a gate receiving the clock signal CK. The NMOS transistor 217 is connected to the evaluation node NE, and has a gate receiving the input data DATA. The NMOS transistor 218 is connected to the NMOS transistor 217, and has a gate receiving the second control clock signal CCK2. The NMOS transistor 219 is connected between the NMOS transistor 218 and the ground, and has a gate receiving the clock signal CK.

Figure 4:
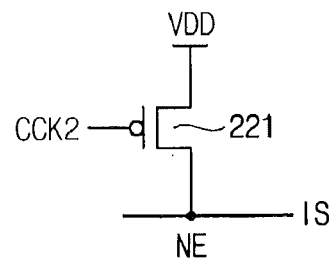
FIG. 4 is a circuit diagram illustrating a keeper circuit of FIG. 2 in accordance with some embodiments.

Referring now to FIG. 4, a circuit diagram illustrating the keeper circuit in FIG. 2 in accordance with some embodiments will be discussed. As illustrated in FIG. 4, a keeper circuit 220a includes a PMOS transistor 221 between the power supply voltage VDD and the evaluation node NE, and has a gate receiving the second control clock signal CCK2. The internal signal IS is provided at the evaluation node NE.

Figure 5:
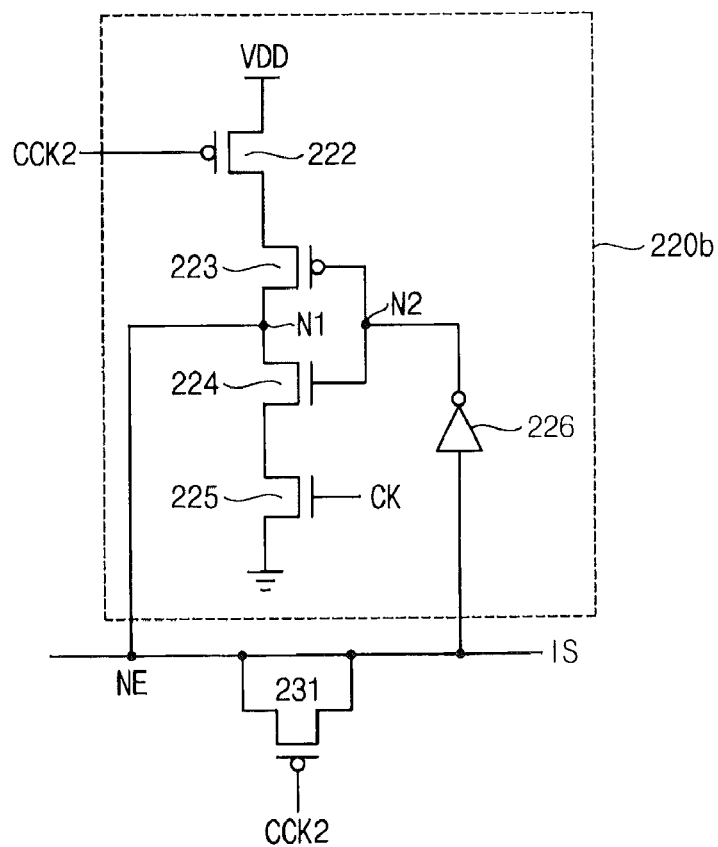
FIG. 5 is a circuit diagram illustrating a keeper circuit of FIG. 2 in accordance with some embodiments.

Referring now to FIG. 5, a circuit diagram illustrating the keeper circuit of FIG. 2 in accordance with some embodiments will be discussed. As illustrated in FIG. 5, the PMOS capacitor 231 is altogether illustrated for explanation. A keeper circuit 220b includes PMOS transistors 222 and 223, NMOS transistors 224 and 225 and an inverter 226. The PMOS transistor 222 has a source connected to the power supply voltage VDD and a gate receiving the second control clock signal CCK2. The PMOS transistor 223 has a source connected to a drain of the PMOS transistor 222 at a first node N1 and a gate connected to an output of the inverter 226 at a second node N2. The NMOS transistor 224 has a drain connected to a drain of the PMOS transistor 223 and has a gate connected to the output of the inverter 226. The NMOS transistor 225 has a drain connected to the source of the NMOS transistor 224 and a source connected to the ground. The first node N1 is connected to the evaluation node NE. The internal signal IS is applied to the gates of the PMOS transistor 223 and the NMOS transistor 224.

Figure 6A:
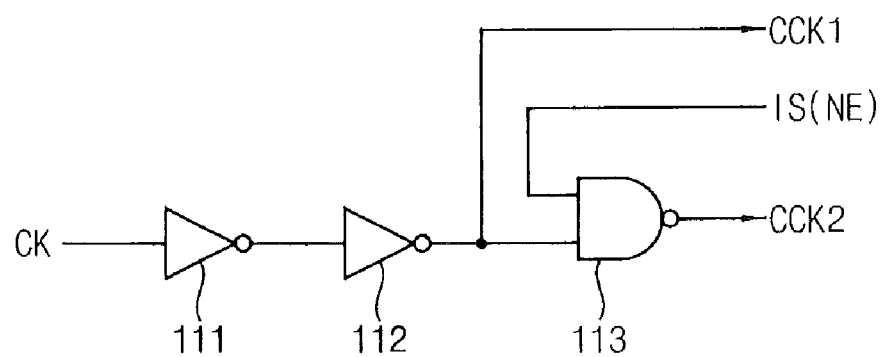
FIGS. 6A and 6B are circuit diagrams illustrating a control clock generator of FIG. 1 in accordance with some embodiments.
Figure 6B:
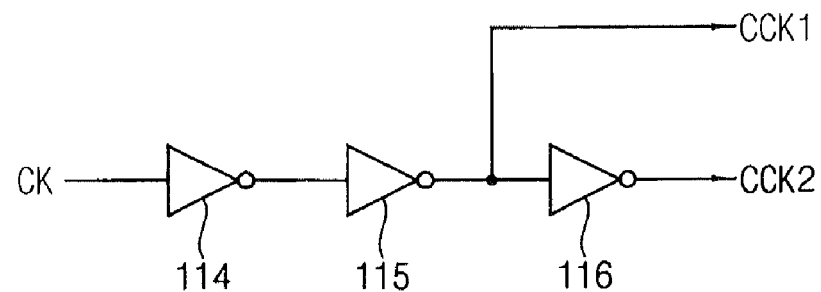

Referring now to FIGS. 6A and 6B, circuit diagrams illustrating examples of the control clock generator of FIG. 1 according to some embodiments will be discussed. As illustrated in FIG. 6A, a control clock generator 100a according to some embodiments may include inverters 111 and 112 and a NAND gate 113. The inverter 111 inverts the clock signal CK. The inverter 112 inverts output of the inverter 111 to be provided as the first control clock signal CCK1. Therefore, the first control clock signal CCK1 is delayed by a delay corresponding to two inverters 111 and 112 with respect to the clock signal CK. The NAND gate 113 performs NAND operation on output of the inverter 112 and the logic level of the evaluation node NE (i.e., the internal signal IS) to provide the second control clock signal CCK2. Therefore, the second control clock signal CCK2, output of the NAND gate 113, reflects the logic level of the evaluation node NE.

Referring now to FIG. 6B, a control clock generator 100a according to some example embodiments may include inverters 114, 115 and 116. The inverter 114 inverts the clock signal CK. The inverter 115 inverts output of the inverter 114 to be provided as the first control clock signal CCK1. Therefore, the first control clock signal CCK1 is delayed by a delay corresponding to two inverters 114 and 115. The inverter 116 inverts output of the inverter 115 to be provided as the second control clock signal CCK2. Therefore, the second control clock signal CCK2 is delayed by a delay corresponding to three inverters 114, 115 and 116 with respect to the clock signal CK. Furthermore, the second control clock signal CCK2 does not reflect the logic level of the evaluation node NE in FIG. 6B.

That is, the control clock generator 100 in FIG. 1 generates the first and second control clock signal CCK1 and CCK2 based on at least the clock signal CK.

Figure 7:
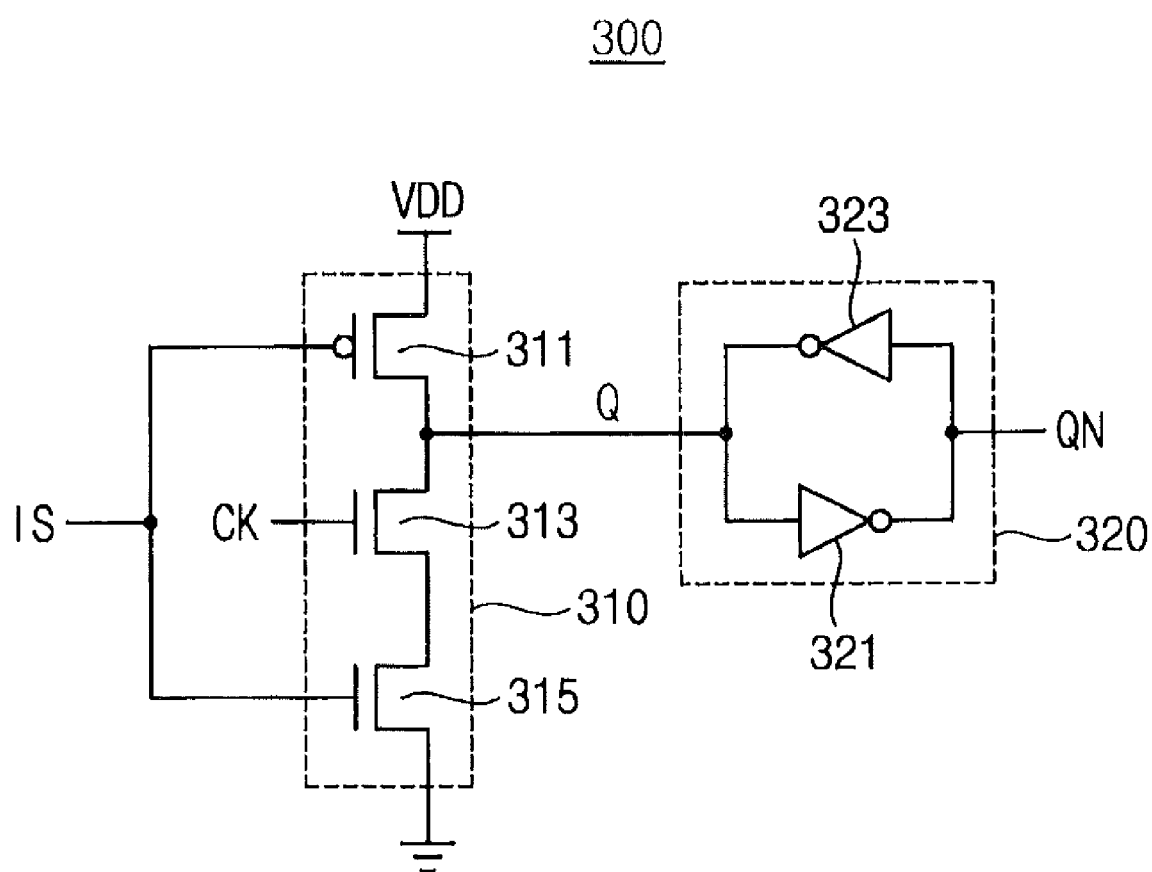
FIG. 7 is a circuit diagram illustrating a static output unit of FIG. 1 in accordance with some embodiments.

Referring now to FIG. 7, a circuit diagram illustrating an example of the static output unit of FIG. 1 in accordance with some embodiments will be discussed. As illustrated in FIG. 7, the static output unit 300 includes a driver 310 and a latch unit 320. The driver 310 maintains the state of the output data Q or inverts the internal signal IS to be provided as the output data Q according to the phase of the clock signal CK.

For example, when the clock signal CK is in the first phase, the driver 310 maintains the state of the output data Q regardless of the logic level of the internal signal IS. When the clock signal CK is in the second phase, the driver 310 inverts the internal signal IS to be provided as the output data Q. The driver 310 may include a PMOS transistor 311 and NMOS transistors 313 and 315. The PMOS transistor 311 is connected to the power supply voltage VDD and has a gate receiving the internal signal IS. The NMOS transistor 313 is connected to the PMOS transistor 311 and has a gate receiving the clock signal CK. The NMOS transistor 315 is connected between the NMOS transistor 313 and the ground and has a gate receiving internal signal IS.

The latch unit 320 latches the output data Q to provide the latched output data as an inverted output data QN. The latch unit 320 may include inverters 321 and 323 which are back-to-back connected with respect to each other.

Figure 8:
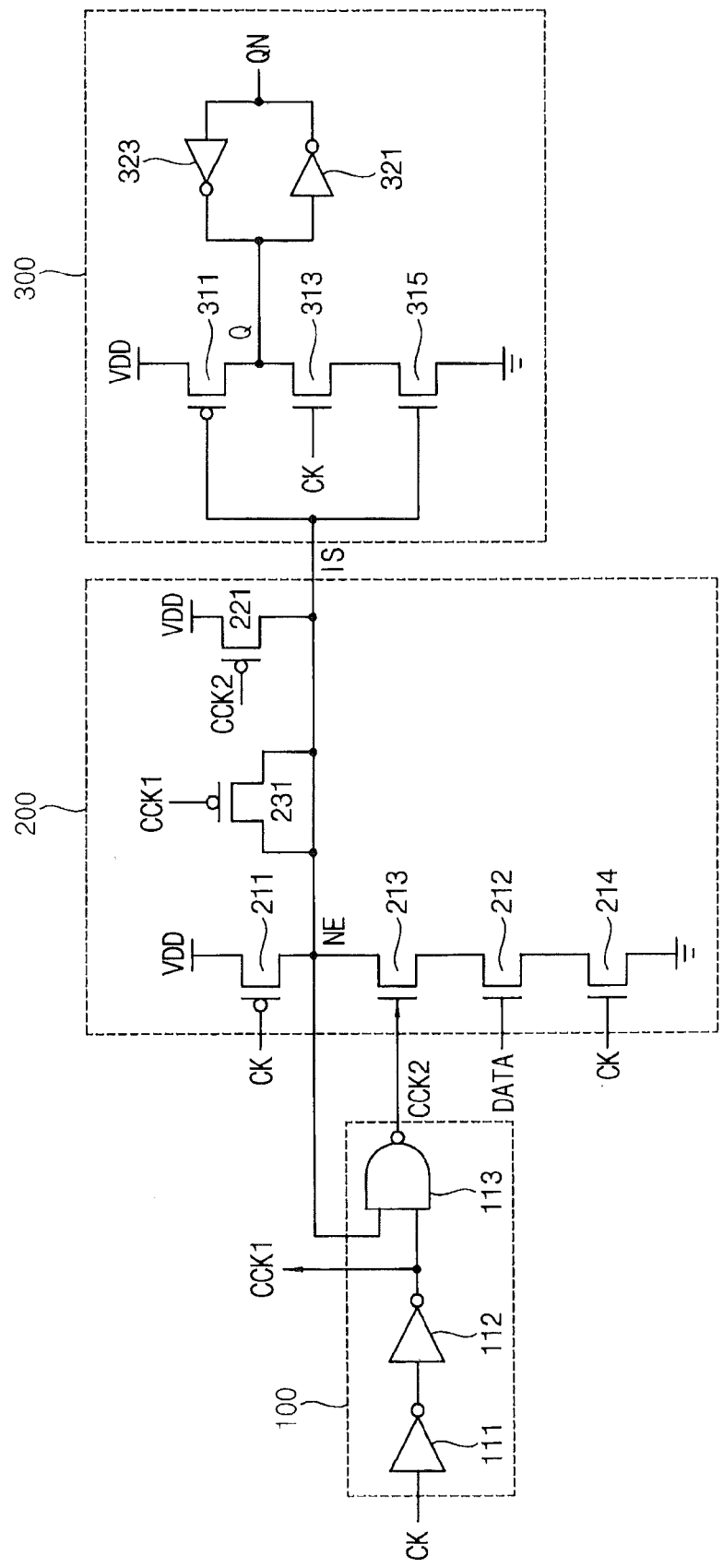
FIG. 8 is a circuit diagram illustrating a flip-flop circuit of FIG. 1 according to some embodiments.

Referring now to FIG. 8, a circuit diagram illustrating the flip-flop circuit of FIG. 1 in accordance with some embodiments will be discussed. As illustrated in FIG. 8, the control clock generator 100a of FIG. 6A is used as the control clock generator 100, the dynamic input unit 200 of FIG. 2 is used, and the static output unit 300 of FIG. 7 is used.

Operations of the flip-flop circuit according to example embodiments will be described with reference to FIG. 8.

When the clock signal CK is in the first phase (i.e., logic low level), the PMOS transistor 211 is conducted. Accordingly, the evaluation node NE is precharged to the power supply voltage VDD, and the NMOS transistor 214 is not conducted. Therefore, a conducting path from the evaluation node NE to the ground is blocked, and thus, the evaluation node NE is logic high level regardless of the input data DATA. At this time, the first control clock signal CCK1 is also logic low level, the second control clock signal CCK2, i.e., output of the NAND gate 113 is logic high level. Accordingly, the NMOS transistor 213 is not conducted, and the PMOS transistor 221 is not conducted. Therefore, the static output unit 300 maintains a previous state of the output data Q regardless of the logic level of the evaluation node NE, i.e., the internal signal IS, because the NMOS transistor 313 is not conducted in response to the clock signal CK in the first phase. At this time, the PMOS capacitor 231 traps charges from the PMOS transistor 221 into channel of the PMOS capacitor 231 because the PMOS transistor 221 is not conducted in response to the second control clock signal CCK2 in logic high level.

Thereafter, when the clock signal CK is in the second phase (i.e., logic high level), the PMOS transistor 211 is not conducted, and the NMOS transistor 214 is conducted. Accordingly, the evaluation node NE is discharged to the ground voltage or is maintained at logic high level depending on the logic value of the input data DATA. When the input data DATA is logic high (i.e., digital "1"), the evaluation node NE is discharged to the ground voltage and the second control clock signal CCK is maintained at logic high level. Accordingly, the NMOS transistor 213 is maintained at being conducted, and the PMOS transistor 221 included in the keeper circuit 220 is maintained at not being conducted. Therefore, when the evaluation node NE is discharged, there is no signal fighting at the evaluation node NE. Since there is no signal fighting at the evaluation node NE, the evaluation node NE may be discharged more quickly by increasing a size of the PMOS transistor 221. When the evaluation node NE may be discharged more quickly, the operating speed of the flip-flop circuit may be increased. When the clock signal CK is in the second phase, the driver 310 in the static output unit 300 inverts the internal signal IS to provide the output data Q.

When the input data DATA is logic low (i.e., digital "0"), the conducting path from the evaluation node NE to the ground is blocked, the evaluation node NE is maintained at logic high level. When the evaluation node NE is maintained at logic high level, the second control clock signal CCK2 transitions to logic low level with delay with respect to the clock signal CK. When the second control clock signal CCK2 transitions to logic low level, the NMOS transistor 213 is not conducted, and the PMOS transistor 221 is conducted. Accordingly, the evaluation node NE is maintained at logic high level. However, while the evaluation node NE is maintained at logic high level, the output data Q transitions to logic low level. Accordingly, voltage level of the evaluation node NE drops because of a parasitic capacitance between a gate and a drain of the PMOS transistor 311. However, when the clock signal CK transitions to logic high level, the first control clock signal CCK1 transitions to logic high level with delay with respect to the clock signal CK because of the compensation circuit 230 which is implemented with the PMOS transistor 231. Furthermore, when first control clock signal CCK1 transitions to logic high level, charges trapped in channels of the PMOS capacitor 231 are injected to the evaluation node NE through drain and source of the PMOS capacitor 231, thereby increasing the voltage level of the evaluation node NE.

Therefore, the voltage drop of the evaluation node NE due to the parasitic capacitance of the PMOS transistor 311 may be compensated for according to example embodiments when the clock signal CK is in the second phase and the input data DATA is low level. When the clock signal CK switches between the first and second phase, the above-described explanation is repeated.

Figure 9:
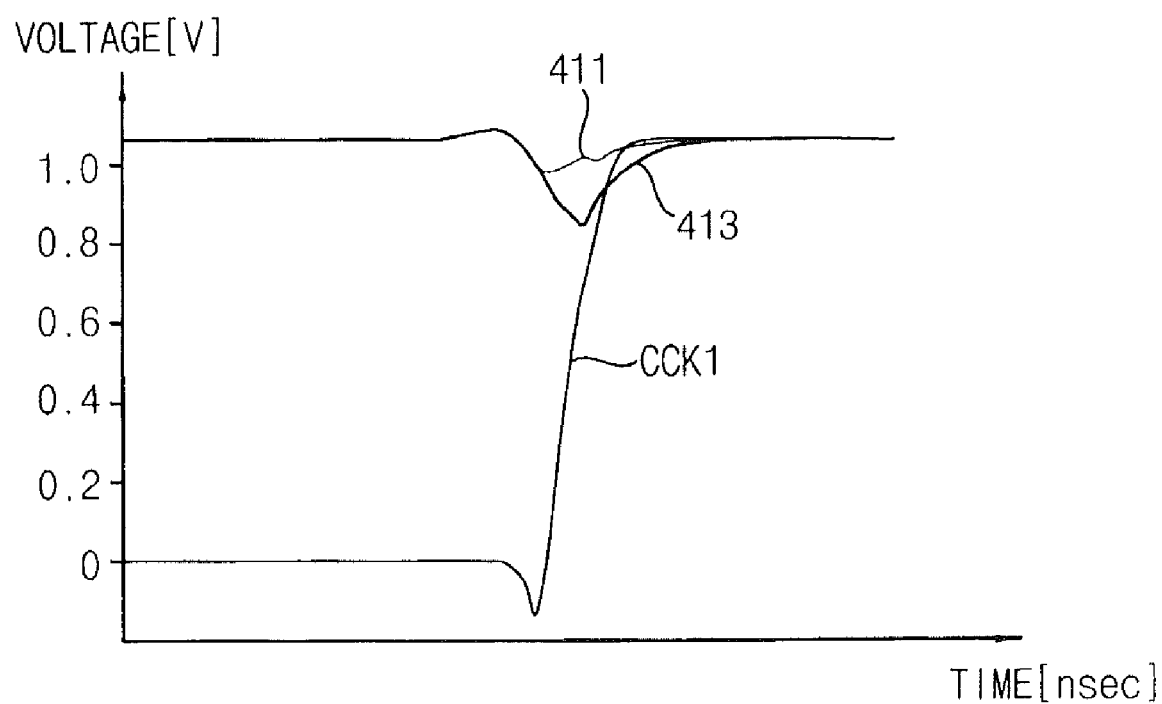
FIG. 9 is a graph illustrating voltage vs. time to show the voltage level of the evaluation node depending on low to high transition of the first control clock signal.

FIG. 9 is a graph illustrating voltage vs. time to show the voltage level of the evaluation node NE depending on low to high transition of the first control clock signal CCK1. Although the clock signal CK is not illustrated, the first control clock signal CCK1 is delayed by a delay corresponding to two inverters 111 and 112 with respect to the clock signal CK.

As illustrated in FIG. 9, a reference numeral 411 indicates a case where the flip-flop circuit includes the compensation circuit 230 as illustrated in FIG. 2 or FIG. 8, and a reference numeral 413 indicates a case where the flip-flop circuit does not include the compensation circuit 230.

Referring to FIG. 9, when the flip-flop circuit includes the compensation circuit 230 according to some example embodiments, the voltage drop of the evaluation node NE in response to the low to high transition of the first control clock signal CCK is substantially decreased as the reference numeral 411 indicates when compared with the case where the flip-flop circuit does not include the compensation circuit as the reference numeral 413 indicates.

The flip-flop circuit 10 of FIG. 8 may use the control clock generator 100b of FIG. 6B instead of the control clock generator 100a of FIG. 6A, and the keep circuit 220b in FIG. 5 instead of the keeper circuit 220a of FIG. 4 without departing from the scope of the present invention.

Figure 10:
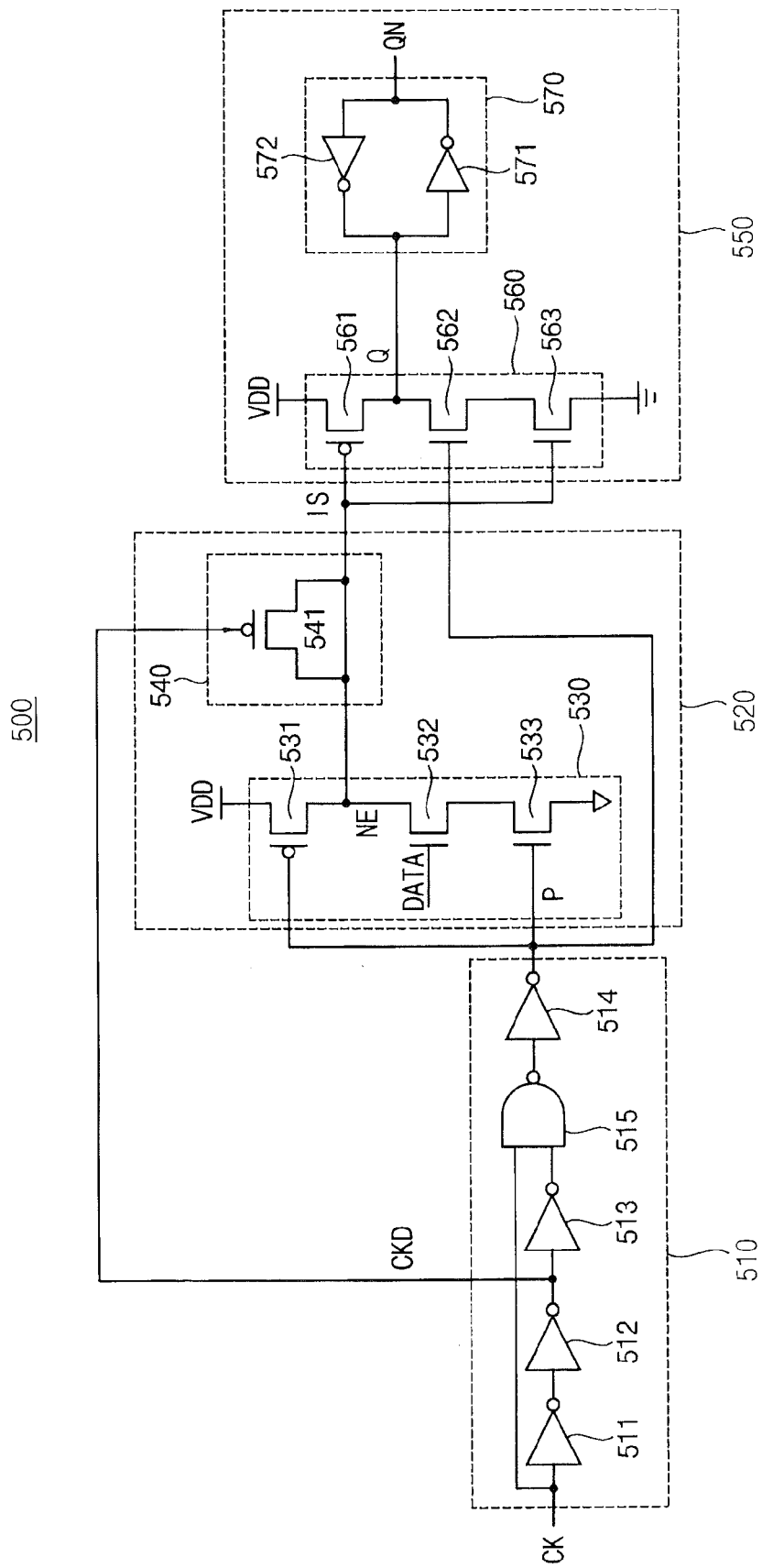
FIG. 10 is a circuit diagram illustrating flip-flop circuits in accordance with some embodiments.

Referring now to FIG. 10, a circuit diagram illustrating an example of a flip-flop circuit according to some embodiments will be discussed. As illustrated in FIG. 10, a flip-flop circuit 500 includes a pulse generator 510, a dynamic input unit 520 and a static output unit 550. The pulse generator 510 includes inverters 511, 512, 513 and 514 and a NAND gate 515. The inverter 511 inverts a clock signal CK. The inverter 512 inverts output of the inverter 511 and provides a delayed clock signal CKD. The inverter 513 inverts output of the inverter 512. The NAND gate 515 performs a NAND operation on the clock signal CK and output of the inverter 513. The inverter 514 inverts output of the NAND gate 515 and provides a pulse signal P. Accordingly, the delayed clock signal CKD is delayed by a delay corresponding to the inverters 511 and 512 with respect to the clock signal CK, and the pulse signal P is delayed by a delay corresponding to the inverters 511, 512, 513 and 514 and the NAND gate 515 with respect to the clock signal CK. Furthermore, the pulse signal P transitions from low to high level in synchronization with a rising edge of the clock signal CK.

Figure 11:
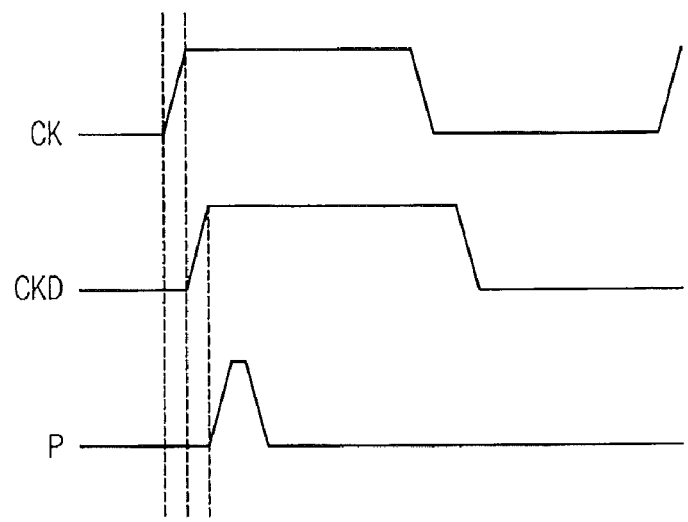
FIG. 11 is a timing diagram illustrating operations of flip-flop circuits of FIG. 10 in accordance with some embodiments.

FIG. 11 is a timing diagram illustrating signals of the flip-flop circuit of FIG. 10 in accordance with some embodiments. It is noted that the delayed clock signal CKD is delayed by a delay corresponding to the inverters 511 and 512 with respect to the clock signal CK, and the pulse signal P is delayed by a delay corresponding to the inverters 511, 512, 513 and 514 and the NAND gate 515 with respect to the clock signal CK. Furthermore, it is also noted that the pulse signal P transitions from low to high level in synchronization with the rising edge of the clock signal CK and that the pulse signal P has a more narrow second phase (i.e., logic high state) than a first phase (i.e., logic low state).

Referring again to FIG. 11, the dynamic input unit 520 includes an evaluation unit 530 and a compensation circuit 540. The evaluation unit 530 includes a plurality of transistors 531~533 which are cascade-connected between a power supply voltage VDD and a ground. The plurality of transistors 531~533 include a PMOS transistor 531 and NMOS transistors 532 and 533. The PMOS transistor 531 is connected between the power supply voltage VDD and the evaluation node NE, and has a gate receiving the pulse signal P. The NMOS transistor 522 is connected to the evaluation node NE, and has a gate receiving input data DATA. The NMOS transistor 532 is connected between the NMOS transistor 532 and the ground, and has a gate receiving the pulse signal P. The NMOS transistor 532 may be replaced with a plurality of NMOS transistors as illustrated in FIG. 3B. Furthermore, the NMOS transistor 533 may be connected between the PMOS transistor 531 and the NMOS transistor 532 as illustrated in FIG. 3B.

The evaluation unit 520 precharges the evaluation node NE to a level of the power supply voltage VDD in the first phase of the pulse signal P, and selectively discharges the evaluation node NE in the second phase of the pulse signal P according to the input data DATA. For example, when the input data DATA is high level, the evaluation node NE is discharged, and when the input data DATA is low level, the evaluation node NE is maintained at logic high level. An internal signal IS reflecting the evaluation result is provided at the evaluation node NE.

The compensation circuit 540 may include a PMOS capacitor 541 which has a gate receiving the delayed clock signal CKD, a drain connected to the evaluation node NE and a source connected to the evaluation node NE. The PMOS capacitor 541 injects charges to the evaluation node NE in response to low to high transition of the delayed clock signal CKD.

The static output unit 550 includes a driver 560 and a latch unit 570. The driver 560 maintains the state of the output data Q or inverts the internal signal IS to be provided as the output data Q according to the phase of the pulse signal P.

For example, when the pulse signal P is in the first phase, the driver 560 maintains the state of the output data Q regardless of the logic level of the internal signal IS. When the pulse signal P is in the second phase, the driver 560 inverts the internal signal IS to be provided as the output data Q. The driver 560 may include a PMOS transistor 561 and NMOS transistors 562 and 563. The PMOS transistor 561 is connected to the power supply voltage VDD and has a gate receiving the internal signal IS. The NMOS transistor 562 is connected to the PMOS transistor 561 and has a gate receiving the pulse signal P. The NMOS transistor 563 is connected between the NMOS transistor 562 and the ground and has a gate receiving internal signal IS.

The latch unit 570 latches the output data Q to provide the latched output data as an inverted output data QN. The latch unit 570 may include inverters 571 and 572 which are back-to-back connected with respect to each other.

Hereinafter, operation of the flip-flop circuit of FIG. 11 according some embodiments with respect to FIGS. 11 and 12 will be described. Operations of flip-flop circuit 500 of FIG. 11 are similar to operation of the flip-flop circuit 10 of FIG. 8, and therefore repeated description will be omitted. That is, description about a case when the input data DATA is high level will be omitted.

When the pulse signal P is in the first phase (i.e., logic low level), the PMOS transistor 531 is conducted. Accordingly, the evaluation node NE is precharged to the power supply voltage VDD, and the NMOS transistor 532 is not conducted. Therefore, a conducting path from the evaluation node NE to the ground is blocked, and thus, the evaluation node NE is logic high level regardless of the input data DATA. At this time, the delayed clock signal CKD is logic low level, and the PMOS capacitor 541 is conducted. Accordingly charges are trapped in channels of the PMOS capacitor 541. Furthermore, the NMOS transistor 562 is not conducted, and thus the static output unit 550 maintains a previous state of the output data Q regardless of the logic level of the evaluation node NE.

Thereafter, when the pulse signal P transitions to the second phase (i.e., logic high level), the NMOS transistor 532 is conducted while the pulse signal P is maintained at the second phase, and the evaluation node NE is discharged to the ground voltage. However, the output data Q transitions to logic low level. Accordingly, the voltage level of the evaluation node NE drops because of a parasitic capacitance between a gate and a drain of the PMOS transistor 651. When the voltage level of the evaluation node NE drops because of a parasitic capacitance between a gate and a drain of the PMOS transistor 651, the output data Q may not be maintained at logic high level regardless of the output data Q having the necessity of being maintained at logic high level. In this case, the flip-flop circuit 500 may not provide exact output data Q. However, when the flip-flop circuit 500 includes the compensation circuit 540, charges trapped in channels of the PMOS capacitor 541 are injected to the evaluation node NE through drain and source of the PMOS capacitor 231 in response to the delayed control signal with logic high level, thereby compensating for the voltage drop of the evaluation node NE.

Therefore, the voltage drop of the evaluation node NE due to the parasitic capacitance of the PMOS transistor 531 may be compensated for according to example embodiments when the pulse signal P is in the second phase and the input data DATA is low level. When the pulse signal P switches between the first and second phase, the above-described explanation is repeated.

Figure 12:
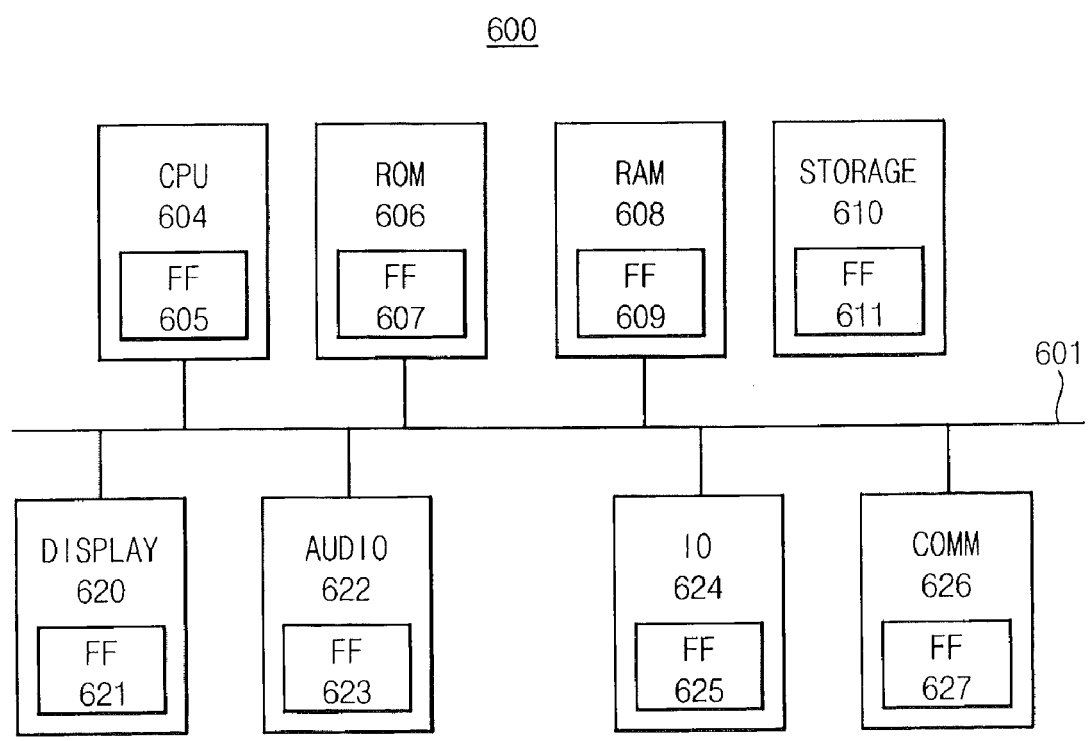
FIG. 12 is a block diagram illustrating systems in accordance with some embodiments discussed herein.

Referring now to FIG. 12, a block diagram illustrating an example of a computer system according to some embodiments will be discussed. As illustrated in FIG. 12, a computer system 600 includes bus system 601 which interconnects a central processing unit (CPU) 604, read only memory (ROM) 604, random access memory (RAM) 608, a storage device 610, a display device 620 an audio device 622, an input/output (I/O) device 624 and a communication device 626. The bus system 601 may be for example, one or more such buses as a system bus, peripheral component interconnect (PCI), and advanced graphics port (AGP). The CPU 604 may be a single, multiple, or even a distributed computing resource. The ROM 606 may be may be any type of non-volatile memory, which may be programmable such as, mask programmable, flash, etc. The RAM 608 may be, for example, static, dynamic, synchronous, asynchronous, or any combination. The storage device 610 may be compact disk (CD), digital versatile disk (DVD), hard disks optical disks, tape, flash, memory sticks, video recorders, etc. The display device 620 may be, for example, a cathode ray tube (CRT), a liquid crystal display (LCD), a projection system, television, etc. The audio device 622 may be a monophonic, stereo, three dimensional sound card, etc. The I/O device 624 may be a keyboard, a mouse, etc. The communication device 626 may be an Ethernet adapter for local area network (LAN), a wireless mode, a cable modem, etc.

A flip-flop circuit 605 in the CPU 604 may be used to store the results of processing. The flip-flop circuit 605 may be used to latch signals from the bus system 601. A flip-flop circuit 607 in the ROM 606 may store the results of an access for presentation an output on the bus system 601. A flip-flop circuit 609 in the RAM 608 may store the results of an access for presentation as an output on the bus system 601. RAM 608 may embody the flip-flop circuit 609 to latch an address that the bus system 601 presents to the RAM 608. The storage device 610 may embody the flip-flop circuit 611, as an output storage device to present its output to the bus system 601. The display device 620 may use a flip-flop circuit 621 to latch a display signal. The audio device 622 may use a flip-flop circuit 623 to store input ad/or output signals received/sent to the bus system 601. The I/O device 624 may use a flip-flop circuit 625 to store the results of input and output. The communication device 626 may be, for example, an Ethernet adapter which may use a flip-flop circuit 627 to store the results of the received packet.

Each of the flip-flop circuits 605, 607, 609, 611, 621, 623, 625 and 627 may employ the flip-flop circuit 10 of FIG. 1 or the flip-flop circuit 500 of FIG. 10. Therefore, the computer system of FIG. 12 operates at relatively high speed while robust to noises.

As mentioned above, the flip-flop circuit may compensate for the voltage drop due to the parasitic capacitance by injecting the charges according to example embodiments. Therefore, the flip-flop circuit may be applicable to computer systems which require high speed and noise immunity.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A flip-flop circuit comprising:
   a dynamic input unit configured to precharge an evaluation node to a power supply voltage in a first phase of a clock signal, configured to selectively discharge the evaluation node based on input data in a second phase of the clock signal, and configured to compensate for voltage drop of the evaluation node in response to a first control clock signal; and
   a control clock generator configured to generate the first control clock signal and a second control clock signal based on at least the clock signal,
   wherein the dynamic input unit comprises:
   an evaluation unit that includes a plurality of transistors and the evaluation node, each of the transistors receiving each of the clock signal, the second control clock signal and the input data;
   a keeper circuit, connected to the evaluation node, configured to maintain voltage level of the evaluation node in response to the second control clock signal; and
   a compensation circuit, connected to the evaluation node, configured to compensate for voltage drop of the evaluation node in response to the first control clock signal, wherein the compensation circuit comprises a PMOS capacitor which has a gate receiving the first control clock signal and a source and a drain which are connected to the evaluation node.

2. The flip-flop circuit of claim 1, further comprising:
   a static output unit configured to maintain a state of output data in the first phase of the clock signal and configured to invert an internal signal to provide the output data in the second phase of the clock signal, wherein the internal signal is provided at the evaluation node.

3. The flip-flop circuit of claim 2, wherein the static output unit comprises:
   a driver configured to maintain a state of the output data or invert the internal signal to provide the output data depending on the phase of the clock signal; and
   a latch unit that latches the out data to provide an inverted output data.

4. The flip-flop circuit of claim 1, wherein the evaluation unit comprises:

a p-channel metal oxide semiconductor (PMOS) transistor, connected between a power supply voltage and the evaluation node, which has a gate receiving the clock signal;

a first n-channel metal oxide semiconductor (NMOS) transistor, connected to the evaluation node, which has a gate receiving the second control clock signal;

at least one second NMOS transistor, connected to the first NMOS transistor, which has a gate receiving the input data; and a third NMOS transistor, connected between the second NMOS transistor and a ground, which has a gate receiving the clock signal.

5. The flip-flop circuit of claim 4, wherein the input data includes a plurality of bits, and the at least one second NMOS transistor includes a plurality of transistors, each gate of the transistors receiving each bit of the input data.

6. The flip-flop circuit of claim 1, wherein the evaluation unit comprises:

a PMOS transistor, connected between a power supply voltage and the evaluation node, which has a gate receiving the clock signal;

a first NMOS transistor, connected to the evaluation node, which has a gate receiving the input data;

a second NMOS transistor, connected to the first NMOS transistor, which has a gate receiving the second control clock signal; and a third NMOS transistor, connected between the second NMOS transistor and a ground, which has a gate receiving the clock signal.

7. The flip-flop circuit of claim 1, wherein the PMOS capacitor compensates for the voltage drop of the evaluation node by injecting trapped charges to the evaluation node in response to low to high transition of the first control clock signal.

8. The flip-flop circuit of claim 1, wherein the keeper circuit comprises:

a first PMOS transistor, connected to a power supply voltage, which has a gate receiving the second control clock signal;

a second PMOS transistor connected between the first PMOS transistor and a first node connected to the evaluation node; and a first NMOS transistor connected to the second NMOS transistor at the first node;

a second NMOS transistor, connected between the first NMOS transistor and a ground, which has a gate receiving the clock signal;

an inverter connected between the evaluation node and a second node at which gates of the second PMOS transistor and the first NMOS transistor are commonly connected.

9. The flip-flop circuit of claim 1, wherein the control clock generator comprises:

a first inverter that inverts the clock signal;

a second inverter that inverts output of the first inverter to provide the first control clock signal; and a NAND gate that performs a NAND operation on output of the second inverter and an internal signal to provide the second control clock signal, the internal signal being provided at the evaluation node.

10. The flip-flop circuit of claim 1, wherein the control clock generator comprises:

a first inverter that inverts the clock signal;

a second inverter that inverts output of the first inverter to provide the first control clock signal; and a third inverter that inverts output of the second inverter to provide the second control clock signal.

11. A flip-flop circuit comprising:

a dynamic input unit configured to precharge an evaluation node to a power supply voltage in a first phase of a clock signal, configured to selectively discharge the evaluation node based on input data in a second phase of the clock signal, and configured to compensate for voltage drop of the evaluation node in response to a first control clock signal; and a control clock generator configured to generate the first control clock signal and a second control clock signal based on at least the clock signal, wherein the dynamic input unit comprises:

an evaluation unit that includes a plurality of transistors and the evaluation node, each of the transistors receiving each of the clock signal, the second control clock signal and the input data;

a keeper circuit, connected to the evaluation node, configured to maintain voltage level of the evaluation node in response to the second control clock signal; and a compensation circuit, connected to the evaluation node, configured to compensate for voltage drop of the evaluation node in response to the first control clock signal, wherein the keeper circuit comprises a PMOS transistor, connected between a power supply voltage and the evaluation node, which has a gate receiving the second control clock signal.

* * * * *